(12) United States Patent
Huang et al.

(10) Patent No.: US 8,018,309 B2
(45) Date of Patent: Sep. 13, 2011

(54) METHOD FOR IMPROVING THE EFFICIENCY OF A POWER SUPPLY DEVICE

(75) Inventors: Wen-Hung Huang, Taipei (TW); Ming-Chu Kuo, Jung-Li (TW); Hsien Tsung Lin, Taipei Hsien (TW)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 12/256,949

(22) Filed: Oct. 23, 2008

(65) Prior Publication Data

US 2009/0040003 A1 Feb. 12, 2009

Related U.S. Application Data

(62) Division of application No. 11/410,425, filed on Apr. 25, 2006, now Pat. No. 7,514,765.

(51) Int. Cl.
*H01F 38/12* (2006.01)
(52) U.S. Cl. ........... 336/84 M; 336/200; 336/232
(58) Field of Classification Search ........... 336/84 M, 336/200, 232
See application file for complete search history.

(56) References Cited

U.S. PATENT DOCUMENTS

| | | | | |
|---|---|---|---|---|
| 3,185,093 | A * | 5/1965 | Holinbeck | 102/202.2 |
| 4,032,959 | A * | 6/1977 | Boom et al. | 323/234 |
| 5,111,174 | A * | 5/1992 | Kriz | 336/73 |
| 5,568,112 | A * | 10/1996 | Cure | 335/214 |
| 6,888,438 | B2 * | 5/2005 | Hui et al. | 336/200 |
| 6,967,553 | B2 * | 11/2005 | Jitaru | 336/178 |
| 7,005,955 | B2 * | 2/2006 | Schumacher | 336/200 |
| 7,262,069 | B2 * | 8/2007 | Chung et al. | 438/48 |
| 7,310,202 | B2 * | 12/2007 | Kief et al. | 360/123.01 |
| 7,495,625 | B2 * | 2/2009 | Endo et al. | 343/788 |
| 2004/0080978 | A1 * | 4/2004 | Jitaru | 365/173 |
| 2006/0071311 | A1 | 4/2006 | Kertesz et al. | |
| 2007/0001796 | A1 * | 1/2007 | Waffenschmidt et al. | 336/223 |
| 2007/0164435 | A1 | 7/2007 | Koshiishi et al. | |
| 2008/0012097 | A1 | 1/2008 | Takahashi et al. | |

* cited by examiner

*Primary Examiner* — Elvin G Enad
*Assistant Examiner* — Joselito Baisa
(74) *Attorney, Agent, or Firm* — Haynes and Boone, LLP

(57) ABSTRACT

For improving efficiency of a power device having an exposed surface capable of radiating energy, a shielding layer is disposed in between the exposed surface and a conductive layer. The shielding layer causes at least a portion of the energy to be directed back into the power device, thereby substantially preventing the energy from inducing eddy currents in the conductive layer. The conductive layer is fabricated from a metal foil for compliance with electromagnetic energy leakage regulations.

8 Claims, 3 Drawing Sheets

METHOD FOR IMPROVING THE EFFICIENCY OF A POWER SUPPLY DEVICE

CROSS REFERENCE TO RELATED APPLICATIONS

The present application claims priority to and is a divisional of co-owned co-pending U.S. application Ser. No. 11/410,425, filed on Apr. 25, 2006, the disclosure which is incorporated herein by reference.

BACKGROUND

The present disclosure relates to power supply systems, and more particularly for an improved efficiency of a power supply system providing power to an information handling system.

As the value and use of information continues to increase, individuals and businesses seek additional ways to acquire, process and store information. One option available to users is information handling system (IHS). The IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, entertainment, and/or global communications. In addition, IHSs may include a variety of hardware and software components that may be configured to process, store, and communicate information and may include one or more computer systems, data storage systems, and networking systems.

Liquid crystal display (LCD) panel based display devices have been commonly utilized in many IHSs due to their compact size, and low power consumption. Power supply systems that supply power to LCDs typically generate a high voltage to initially turn on the LCD and then lower the voltage when current begins to flow through the LCD. Such power supply systems typically include an inverter circuit to convert a direct current (DC) voltage received as an input to a regulated AC voltage generated as an output.

It is a common practice to cover one or more components of the power supply systems such as the inverter by a metal/aluminum foil and/or use an aluminum-magnesium (AL-MG) LCD cover for limiting the effects of electromagnetic interference (EMI) and/or electromagnetic compatibility (EMC). A user may be often surprised to find out that an LCD panel having the protective aluminum foil may not operate after approximately 30 minutes of operation at the maximum brightness. Failure analysis generally shows a likely occurrence of a shutdown of the power supply system due to an abnormal operating condition.

Therefore, a need exists to improve the reliability and the efficiency of the power supply system. More specifically, a need exists to develop tools and techniques that provide an improved power conversion efficiency of the inverter while providing EMI/EMC containment. Accordingly, it would be desirable to provide for an improved efficiency of a power supply system included in an IHS, absent the disadvantages found in the prior methods discussed above.

SUMMARY

The foregoing need is addressed by the teachings of the present disclosure, which relates to improving efficiency of a power supply system. According to one embodiment, for improving efficiency of a power device having an exposed surface capable of radiating energy, a shielding layer is disposed in between the exposed surface and a conductive layer. The shielding layer causes at least a portion of the energy to be directed back into the power device, thereby substantially preventing the energy from inducing eddy currents in the conductive layer. The conductive layer is fabricated from a metal foil for compliance with electromagnetic energy leakage regulations.

Several advantages are achieved according to the illustrative embodiments presented herein. The embodiments advantageously provide a magnetic shield for minimizing power loss within a power device by advantageously re-directing the energy back into the power device. Because the formation of the eddy currents are substantially reduced by the shielding layer, thermal heating caused by the eddy currents in the conductive layer is also reduced. This advantageously facilitates maintaining the LCD cover within an allowable thermal specification. The embodiments advantageously optimize power efficiency of the power device by substantially limiting the energy from inducing eddy currents on the conductive layer. Thus, portable IHS devices equipped with the power device having the improved efficiency may be more reliable and may operate for longer time without having to be re-charged.

DETAILED DESCRIPTION

Figure 1:
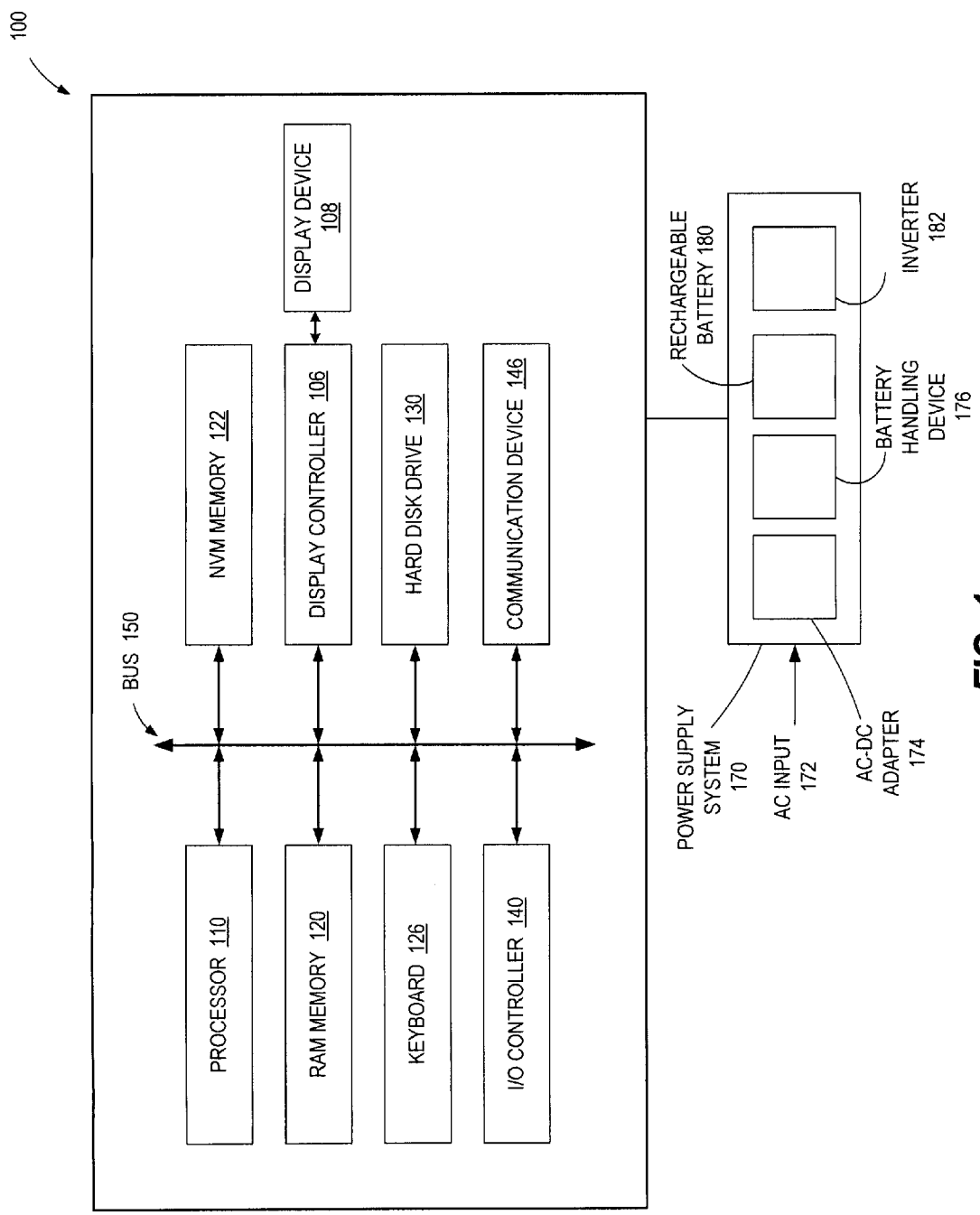
FIG. 1 illustrates a block diagram of an IHS having an improved power supply system, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices, boards, cards, modules, blocks, and/or components described herein may be implemented as hardware (including discrete components, integrated circuits and systems-on-a-chip 'SOC'), firmware (including application specific integrated circuits and programmable chips) and/or software or a combination thereof, depending on the application requirements. Similarly, the functionality of various mechanical elements, members, and/or components for forming modules, sub-assemblies and assemblies assembled in accordance with a structure for an apparatus may be implemented using various materials and coupling techniques, depending on the application requirements.

As described above, a user may be often surprised to find out that an LCD panel having an aluminum foil to limit EMI/EMC, may not operate after approximately 30 minutes of operation at the maximum brightness. Failure analysis generally shows a likely occurrence of a shutdown of the power supply system due to an abnormal operating condition. Thus, a need exists to improve the reliability and the efficiency of the power supply system. According to one embodiment, in a method and system for improving efficiency of a power device having an exposed surface capable of radiating energy, a shielding layer is disposed in between the exposed surface and a conductive layer. The shielding layer causes at least a portion of the energy to be directed back into the power device, thereby substantially preventing the energy from inducing eddy currents in the conductive layer. The conductive layer is fabricated from a metal foil for compliance with electromagnetic energy leakage regulations.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, the IHS may be a personal computer, including notebook computers, personal digital assistants, cellular phones, gaming consoles, a network storage device, or any other suitable device and may vary in size, shape, performance, functionality, and price. The IHS may include random access memory (RAM), one or more processing resources such as central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to receive/transmit communications between the various hardware components.

FIG. 1 illustrates a block diagram of an IHS 100 having an improved power supply system, according to an embodiment. The IHS 100 includes a processor 110, a system RAM 120 (also referred to as main memory), a non-volatile memory (NVM) 122 memory, a display controller 106 coupled to a display device 108, a keyboard 126 and an I/O controller 140 for controlling various other I/O devices. For example, the I/O controller 140 may include a keyboard controller, a cursor device controller and/or the serial I/O controller. In an exemplary, non-depicted embodiment, a printed circuit board such as a motherboard may include one or more electronic components such as the processor 110 and the RAM 120 memory. It should be understood that the term "information handling system" is intended to encompass any device having a processor that executes instructions from a memory medium.

The IHS 100 is shown to include a hard disk drive 130 connected to the processor 110, although some embodiments may not include the hard disk drive 130. In a particular embodiment, the IHS 100 may include additional hard disks. The processor 110 communicates with the system components via a bus 150, which includes data, address and control lines. In one embodiment, the IHS 100 may include multiple instances of the bus 150. In an exemplary, non-depicted embodiment, not all devices shown may be directly coupled to the bus 150. The multiple instances of the bus 150 may be in compliance with one or more proprietary standards and/or one or more industry standards such as PCI, PCIe, ISA, USB, SMBus, and similar others. A communications device 146, such as a network interface card and/or a radio device, may be connected to the bus 150 to enable wired and/or wireless information exchange between the IHS 100 and other devices (not shown).

In a particular embodiment, the IHS 100 receives power from a power supply system 170 that includes one or more power devices such as an alternating current (AC) to direct current (DC) adapter 174, a battery handling device 174, a rechargeable battery 180, and an inverter 182. The power supply system 170 receives an AC input 172 such as 120/240 volts from an electrical wall outlet. The power supply system 170 includes the AC-DC adapter 174 for converting the AC input 172 to a DC output. The battery handling device 174 receives the DC output from the AC-DC adapter 174 to provide power to a load and/or to the battery 180. Thus, the battery handling device 176, which may include a battery charger/battery discharge circuit, fulfills the dual functions of supplying DC power to various components of the IHS and providing a charge to the battery 180. When operating in a battery powered mode, the battery 180 provides the power to the load. The load may include one or more components of the IHS 100 such as the processor 110.

In a particular embodiment, the display device 108 is an LCD and/or a plasma display panel. The inverter 182 converts the DC output from the AC-DC adapter 174 and/or the battery 180 to an AC output (not shown), which is provided to the display device 108. Additional detail of the system and method for improving efficiency of a power device, such as the inverter 182, included in the power supply system 170, is described with reference to FIG. 2.

The processor 110 is operable to execute the computing instructions and/or operations of the IHS 100. The memory medium, e.g., RAM 120, preferably stores instructions (also known as a "software program") for implementing various embodiments of a method in accordance with the present disclosure. An operating system (OS) of the IHS 100 is a type of software program that controls execution of other software programs, referred to as application software programs. In various embodiments the instructions and/or software programs may be implemented in various ways, including procedure-based techniques, component-based techniques, and/or object-oriented techniques, among others. Software may also be implemented using C, XML, C++ objects, Java and Microsoft's .NET technology.

Figure 2:
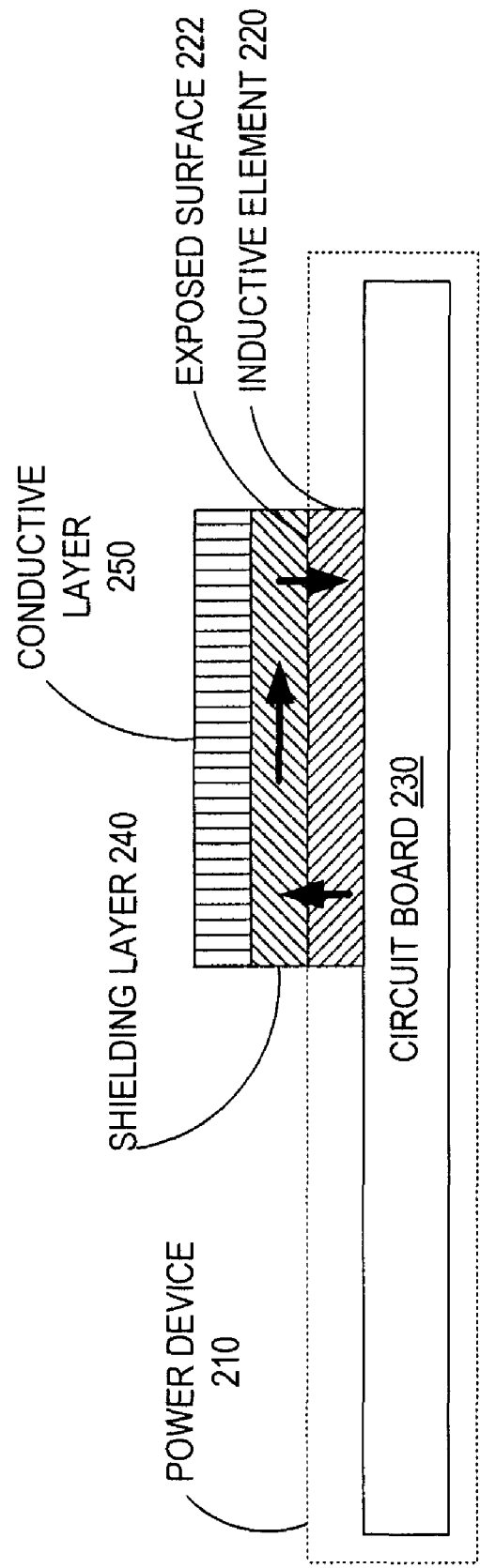
FIG. 2 illustrates a layout block diagram of a power device providing power to the IHS 100 described with referenced to FIG. 1, according to an embodiment.

FIG. 2 illustrates a layout block diagram of a power device 210 providing power to one or more components of the IHS 100 described with referenced to FIG. 1, according to an embodiment. In an embodiment, the power device 210 is the inverter 182. In the depicted embodiment, the power device 210 includes an inductive element 220 mounted on a circuit board 230. The inductive element 220 may include an inductor, a coil, a transformer and similar others.

In a particular embodiment, the inductive element 220 generates the AC output, which is provided to the display device 108. The inductive element 220 includes an exposed surface 222 that is capable of radiating and/or leaking energy, which may be in the form of electrical, magnetic and/or electromagnetic waves. It is understood that the inductive element 220 may include additional exposed surfaces where energy leakage may occur. In the depicted embodiment, a shielding layer 240 is disposed above the exposed surface 222 and a conductive layer 250 is disposed above the shielding layer 240. That is, the shielding layer 240 is disposed in between the exposed surface 222 and the conductive layer 250. In an embodiment, a lower surface of the shielding layer 240 may be disposed above and in direct contact with the exposed surface 222 and the conductive layer 250 may be disposed above and in direct contact with an upper surface of the shielding layer 240.

In a particular embodiment, the shielding layer 240 is a magnetic shield. The shielding layer 240 may be fabricated from at least one of a ferrite sheet and a ferrite core. Because the magnetic flux, field or energy is established more readily through a ferrite material having high permeability (indicates degree of magnetization of a material) than through a non-magnetic material having low permeability, the inductive element 220 is effectively shielded. The ferrite sheet having various thicknesses such as approximately 0.15 millimeters, 0.25 millimeters, and 0.5 millimeters may be cut to fit various sizes and shapes as desired. The ferrite sheet may be advantageously used to cover the exposed surface 222 without utilizing significant additional space within the IHS 100.

The shielding layer 240 causes at least a portion of the energy radiated by the inductive element 220 to be directed back into the inductive element 220. The portion of the energy that is directed back is primarily magnetic energy. Thus, a substantial portion of the magnetic energy that is radiated and/or leaked from the inductive element 220 is directed back into the inductive element 220. The shielding layer 240 substantially prevents the magnetic energy emanating from the inductive element 220 from inducing eddy currents in the conductive layer 250. Specifically, by placing the shielding layer 240 in between the exposed surface 222 and the conductive layer 250, leakage of magnetic energy which flows through the conductive layer 250 to cause a voltage drop and generate eddy currents on the conductive layer 250 is substantially prevented.

Formation of eddy currents is described by Lenz's law, which states that an induced current has a direction such that its magnetic field opposes the change in magnetic field that induced the current. The eddy currents, which are inversely proportional to the resistance of the conductive layer 250, result in an extra loss of power on the conductive layer 250, thereby causing a lower efficiency of the power device 210. The extra power loss and lower efficiency may potentially create an over current condition in the inductive element 220 and cause a shutdown of the power supply system 170. The efficiency and reliability of the power device 210 is advantageously improved by redirecting the energy that is leaked or otherwise lost back into the inductive element 220. The shielding layer 240 reduces the power loss occurring in the inductive element 220. Additionally, because the formation of the eddy currents are substantially reduced by the shielding layer 240, thermal heating caused by the eddy currents in the conductive layer 250 is also reduced, thereby increasing the efficiency of the power device 210.

In a particular embodiment, the conductive layer 250 is fabricated from a metal foil such as an aluminum foil. The conductive layer 250 is advantageously used to limit the amount of energy leakage from the power device 210, thereby maintaining compliance with electromagnetic energy radiation regulations. In an embodiment, the conductive layer 250 is in the form of an LCD cover which may be placed very close to the inductive element 220. The LCD cover may be fabricated from an alloy of aluminum (AL) and magnesium (MG). As described earlier, because the formation of the eddy currents are substantially reduced by the shielding layer 240, thermal heating caused by the eddy currents in the LCD cover is also reduced. This advantageously facilitates maintaining the LCD cover within an allowable thermal specification, especially because the user may often be in physical contact with the LCD cover.

Figure 3:
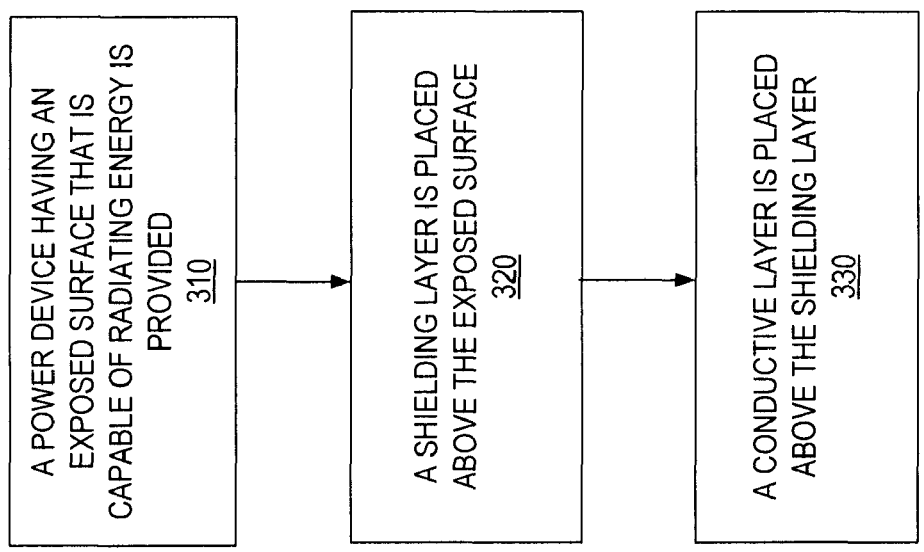
FIG. 3 is a flow chart illustrating a method improving efficiency of a power device, according to an embodiment.

FIG. 3 is a flow chart illustrating a method improving efficiency of a power device, according to an embodiment. In a particular embodiment, the power device is the same as the power device 210 described with reference to FIG. 2. At step 310, a power device having an exposed surface that is capable of radiating energy is provided. At step 320, a shielding layer is placed above the exposed surface. In step 330, a conductive layer is placed above the shielding layer. The placement of the shielding layer in between the exposed surface and the conductive layer causes the energy, especially the magnetic portion, to be directed back into the power device thereby improving the efficiency.

Various steps described above may be added, omitted, combined, altered, or performed in different orders. In a particular embodiment, the power device may be provided with the conductive layer. A shielding layer may be added in between the power device and the conductive layer to redirect the energy back into the power device.

The illustrative embodiments advantageously provide a magnetic shield for minimizing power loss within a power device by advantageously re-directing the magnetic energy back into the power device. The improved method and system advantageously optimizes power efficiency of the power device by substantially preventing the magnetic energy from inducing eddy currents on the conductive layer. Because the formation of the eddy currents are substantially reduced by the shielding layer, thermal heating caused by the eddy currents in the conductive layer is also reduced. This advantageously facilitates maintaining the LCD cover within an allowable thermal specification. Thus, portable IHS devices equipped with the power device having the improved efficiency may be more reliable and may operate for longer time without having the battery to be re-charged.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A method for improving the efficiency of a power supply device, comprising:

providing a power conversion device that that is coupled to an information handling system (IHS) display panel and a power source and that is operable to receive a direct current (DC) input from the power source, wherein the power conversion device includes:

a transformer having a plurality of windings and a physical core that are operable to convert the DC input to an alternating current (AC) output that is sufficient to power the IHS display panel, and wherein the transformer includes an energy radiating outer surface;

a conductive layer that is adjacent to and spaced apart from the transformer; and a magnetic shielding layer located between the energy radiating outer surface of the transformer and the conductive layer;

radiating energy from the energy radiating outer surface of the transformer in response to the plurality of windings and the physical core in the transformer converting the DC input to the AC output in order to power the IHS display panel;

directing energy radiated from the energy radiating outer surface of the transformer back towards the transformer using the magnetic shielding layer, wherein the directing of the energy back towards the transformer prevents that energy from inducing an eddy current in the conductive layer.

2. The method of claim 1, wherein the conductive layer is fabricated from a metal material.

3. The method of claim 1, wherein the magnetic shielding layer is in direct contact with the energy radiating outer surface of the transformer and the conductive layer is in direct contact with the magnetic shielding layer.

4. The method of claim 1, wherein the directing the energy radiated from the energy radiating outer surface of the transformer back towards the transformer further comprises:
   improving the efficiency of the power supply device by reducing a first voltage drop due to a first eddy current in the conductive layer relative to a second voltage drop due to a second eddy current that would exist in the absence of the magnetic shielding layer.

5. The method of claim 1, wherein the shielding layer is fabricated from a ferrite material.

6. The method of claim 5, wherein the ferrite material comprises a ferrite sheet that is approximately 0.25 millimeters thick.

7. The method of claim 1, wherein the power source is selected from the group consisting of a battery and an AC/DC adapter.

8. The method of claim 1, wherein the magnetic shielding layer is located on only one side of the transformer.

\* \* \* \* \*